United States Patent
Frechette et al.

(10) Patent No.: US 11,946,705 B2
(45) Date of Patent: Apr. 2, 2024

(54) DEFORMABLE FIN HEAT EXCHANGER

(71) Applicants: UNIVERSITAT DE LLEIDA, Lleida (ES); SOCPRA SCIENCES ET GENIE S.E.C., Sherbrooke (CA)

(72) Inventors: Luc Frechette, Sherbrooke (CA); Jérôme Barrau, Lleida (ES); Montserrat Vilarrubi Porta, Lleida (ES)

(73) Assignees: UNIVERSITAT DE LLEIDA, Lleida (ES); SOCPRA SCIENCES ET GENIE S.E.C., Sherbrooke (CA)

( * ) Notice: Subject to any disclaimer, the term of this patent is extended or adjusted under 35 U.S.C. 154(b) by 487 days.

(21) Appl. No.: 16/976,157

(22) PCT Filed: Mar. 1, 2019

(86) PCT No.: PCT/CA2019/050247
§ 371 (c)(1),
(2) Date: Aug. 27, 2020

(87) PCT Pub. No.: WO2019/165558
PCT Pub. Date: Sep. 6, 2019

(65) Prior Publication Data
US 2020/0408473 A1    Dec. 31, 2020

Related U.S. Application Data

(60) Provisional application No. 62/637,019, filed on Mar. 1, 2018.

(51) Int. Cl.
F28F 3/02    (2006.01)
(52) U.S. Cl.
CPC ............ *F28F 3/02* (2013.01); *F28F 2215/14* (2013.01)

(58) Field of Classification Search
CPC ................................ F28F 3/02; F28F 2215/14
USPC ........................................................... 165/84
See application file for complete search history.

(56) References Cited

U.S. PATENT DOCUMENTS

| 5,131,456 A | 7/1992 | Wu |
| 9,080,820 B2 | 7/2015 | Bolton |
| 9,169,567 B2 | 10/2015 | Hefner et al. |
| 2007/0205473 A1 | 9/2007 | Youngner et al. |
| 2009/0056350 A1 | 3/2009 | Germann et al. |

(Continued)

FOREIGN PATENT DOCUMENTS

| CN | 104159436 A | 11/2014 |
| EP | 1936468 A1 | 6/2008 |

(Continued)

OTHER PUBLICATIONS

WO2018185410 Oct. 2018—translation.*

*Primary Examiner* — Jon T. Schermerhorn, Jr.
(74) *Attorney, Agent, or Firm* — NORTON ROSE FULBRIGHT CANADA LLP

(57) ABSTRACT

A heat exchanger comprises a base, and a plurality of deformable fins connected to a surface of the base. Some deformable fins have a free end configured to move away from the surface of the base as a function of a local temperature increase of the base. The deformable fins are distributed on the surface of the base to be exposed to a coolant flowing over the surface of the base, wherein a distribution of the deformable fins on the surface of the base is non-uniform.

12 Claims, 9 Drawing Sheets

(56) References Cited

U.S. PATENT DOCUMENTS

2017/0211897 A1     7/2017  Agree
2017/0241721 A1*    8/2017  Liang ..................... F28F 3/048
2021/0051815 A1*    2/2021  Van Wyk .............. H01L 23/467

FOREIGN PATENT DOCUMENTS

EP          2881690 B1      8/2016
JP          2013002735 A    1/2013
WO      WO-2018185410 A1 *  10/2018   .............. F28F 1/128

* cited by examiner

DEFORMABLE FIN HEAT EXCHANGER

CROSS-REFERENCE TO RELATED APPLICATION

The present application claims priority on U.S. Patent Application No. 62/637,019, filed on Mar. 1, 2018 and incorporated herein by reference.

TECHNICAL FIELD

The application relates generally to heat exchangers and, more particularly, to a heat exchanger with adaptive heat transfer capability.

BACKGROUND OF THE ART

The demand for efficient cooling technologies have increased, considering powerful computing devices such as data centers, smart phones and tablets now in use. The small footprints and concentrated power loading in such systems call for development of innovative heat transfer technologies that can efficiently cool hot spots and improve temperature distribution uniformity in order to both improve the efficiency and reliability of the whole systems. Another requirement of these technologies is often to lower the operating costs that are mainly related to the refrigeration and cooling.

Current heat sink devices and like heat exchangers are mainly oriented to reduce the average temperature of a cooled device. In some applications that consist of large surfaces to be cooled, temperature uniformity may be required for good performance. This aspect may be necessary for devices subjected to large energy flows, such as electronic systems or dense array photovoltaic receivers, for improving their reliability and/or their efficiency.

If the heat flux distribution is not uniform, the heat sink can be designed to as a function of the lack of uniformity and still provide a uniform temperature, providing the additional performance and/or reliability. This may only valid if heat load conditions may be kept constant. Indeed, a custom-tailored cooling scheme may not be modified during operation, so it may lead to non-uniform temperature if the heat flux distribution changes.

However, in real conditions, heat flux distribution often changes its mean value and its spatial distribution as a function of time. Accordingly, the custom-tailored designs cooling schemes may not provide the same performance levels when exposed to non-steady state conditions, and could even lead to greater temperature non-uniformities which could further reduce the performance compared to a uniform heat sink design.

SUMMARY

It is therefore an object to provide a heat exchanger that addresses issues related to the prior art.

In one aspect of the present disclosure, there is provided a heat exchanger comprising a base, and a plurality of deformable fins connected to a surface of the base, at least some of the deformable fins having a free end configured to move away from the surface of the base as a function of a local temperature increase of the base, the deformable fins distributed on the surface of the base to be exposed to a coolant flowing over the surface of the base, wherein a distribution of the deformable fins on the surface of the base is non-uniform.

Further in accordance with the aspect, for example, the plurality of deformable fins includes at least a first type of deformable fins and a second type of deformable fins, the first type and the second type differing in size, shape and/or orientation of connection with the surface of the base.

Still further in accordance with the aspect, for example, the distribution includes an upstream area having a first ratio of fin surface per substrate surface and a downstream area having a second ratio of fin surface per substrate surface.

Still further in accordance with the aspect, for example, the second ratio is greater than the first ratio.

Still further in accordance with the aspect, for example, walls may project upwardly from the surface of the base, the walls adapted to be aligned with a coolant flow to define a convection passage.

Still further in accordance with the aspect, for example, at least some of the deformable fins have main heat exchange surfaces generally transverse to a direction of the coolant flow.

Still further in accordance with the aspect, for example, at least some of the deformable fins have main heat exchange surfaces generally parallel to a direction of the coolant flow.

Still further in accordance with the aspect, for example, at least some of the deformable fins have both ends connected to the surface of the base, and forming an arch.

Still further in accordance with the aspect, for example, at least some of the deformable fins are bimetal or bimorphic fins.

Still further in accordance with the aspect, for example, at least some of deformable fins have a body connected at opposed ends to the surface, and a fin portion configured to buckle away from the surface as a function of a local temperature increase of the base.

In accordance with another aspect of the present disclosure, a heat exchanger comprising a base, and a plurality of deformable fins connected to a surface of the base, the deformable fins having a free end configured to move away from the surface of the base as a function of a local temperature increase of the base, the deformable fins distributed on the surface of the base to be exposed to a coolant flowing over the surface of the base, wherein at least one of the deformable fins has a bimorph construction made of a first layer and a second layer by which an area of interconnection is defined between the first layer and the second layer, the first layer having a higher coefficient of thermal expansion than the second layer, wherein the first layer and the second layer have different contours.

Further in accordance with the other aspect, for example, the area of interconnection is smaller than a surface of the first layer excluding the area of interconnection.

Still further in accordance with the other aspect, for example, the area of interconnection is smaller than a surface of the second layer excluding the area of interconnection.

Still further in accordance with the other aspect, for example, the second layer has a greater surface than the first layer.

Still further in accordance with the other aspect, for example, the second layer has at least two discrete anchors to the surface of the base.

Still further in accordance with the other aspect, for example, the second layer has at least two discrete anchors to the surface of the base.

Still further in accordance with the other aspect, for example, the first layer includes at least one elongated strip.

In accordance with another aspect of the present disclosure, A heat exchanger comprising a base, and a plurality of deformable fins connected to a surface of the base, the deformable fins distributed on the surface of the base to be exposed to a coolant flowing over the surface of the base, wherein at least one of the deformable fins has a body connected at opposed ends to the surface, and a fin portion configured to move away from the surface as a function of a local temperature increase of the base, with the body buckling relative to the base.

Further in accordance with the other aspect, for example, the fin portion is triangular shaped.

Still further in accordance with the other aspect, for example, the body is arch shaped.

Still further in accordance with the other aspect, for example, at least some of the deformable fins have both ends connected to the surface of the base, and forming an arch, the body having a coefficient of thermal expansion greater than the base.

DESCRIPTION OF THE DRAWINGS

Reference is now made to the accompanying figures, in which.

DETAILED DESCRIPTION OF THE PREFERRED EMBODIMENTS

Figure 1:
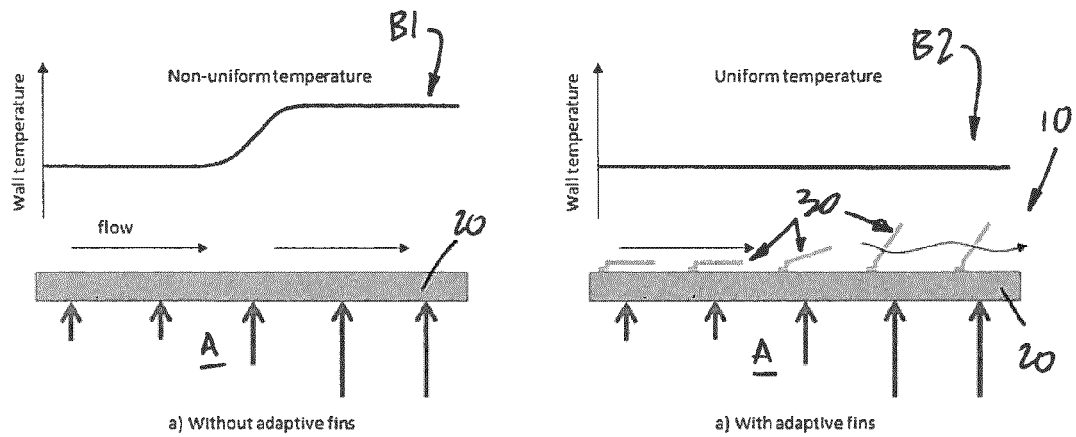
FIG. 1 is a schematic view of a deformable fin heat exchanger in accordance with the present disclosure, showing a principle of operation thereof.

Referring to the drawings and more particularly to FIG. 1, there is shown a deformable fin heat exchanger at 10. In its simplest form, the deformable fin heat exchanger 10 has a plate 20 or like base or substrate, and a plurality of deformable fins 30 thereon. The plurality of deformable fins 30 may be described as a matrix of fins, a distribution of fins, an array of fins, among other possible names.

The plate 20, a.k.a. wall, is in heat exchange relation with a load A. For example, the plate 20 may be conductively contacted against the load A, or against components or materials conductively contacting the load A. Convection heat exchange, radiating heat exchange and/or other types of heat exchange relations are possible between the load A and the deformable fin heat exchanger 10, as alternatives or in combination with the conductive contact. As another example, the plate 20 is part of the load A, i.e., it is an integral part of the system to be cooled. The plate 20 is shown as being substantially planar, but it may also adopt any type of three-dimensional non-planar shape as well. The shape of the plate 20 may be dictated by the geometry of the load/system A. The expression plate 20 is used herein for simplicity, though the deformable fin heat exchanger 10 may have the deformable fins 30 on other bases or substrate.

Still in FIG. 1, a flow of coolant is shown on the left-hand side plate 20 without deformable fins 30, and a non-uniform heat distribution of the load A will result in a non-uniform plate temperature as expressed by graph B1. Similarly, a flow of coolant is shown on the right-hand side plate 20 with deformable fins 30, along with graph B2. The deformable fins 30 deform away from the plate 20 as a function of the local heat flux from the load A. As a result, a non-uniform heat distribution of the load A will result in a variation in the deformation of the deformable fins 30. The deformable fins 30 that are deformed the most due to the higher local heat flux are more exposed to the coolant flow. Accordingly, the impingement of the coolant flow on these deformable fins 30 results in a greater heat exchange than for the deformable fins 30 with less deformation. Consequently, in spite of the non-uniform heat distribution of the load A, the plate temperature is generally uniform, as expressed by graph B2. Deformation is dynamic, as variations in the heat flux from the load A result in corresponding variations in the deformation. Temperature uniformity is one contemplated possibility. It is also contemplated to seek non-uniform temperature distribution on the plate 20, for example to cater to components that may operate more efficiently at warmer temperatures. Accordingly, a more local approach to cooling may be sought and achieved by way of the distribution, size and/or deformation capability of the deformable fins 30.

A transient sequence that allows the quite uniform temperature distribution of the cooled load A as in FIG. 1 is the following:

1—A heat flux (uniform or not), originated by the load A to be cooled, must be evacuated by the plate 20, for example located on the back size of the load A.

2—The coolant fluid (i.e., liquid or gas) flows along the deformable fin heat exchanger 10 where the heat exchange fins 30 are down.

3—In the zones where, as a consequence of the cooling, the heat flux is greater than in other zones, the fins 30 are at a temperature that implies a modification of their geometry and/or a change in their orientation, such as, for example, an increase of angle with respect to the heat exchange surface, i.e., the plane of the plate 20. The fins 30 may be said to be self-regulated and/or passive in that their action is autonomous and is as a function of the heat received from the plate 20 and as a function of the heat exchange with the coolant fluid. A change in geometry is in a three-dimensional (3D) space, i.e., the fins 30 may not change contour, but may curl or bend, resulting in a variation in their shape from a 3D perspective.

4—This change in the fin shape and/or orientation implies an increase of the local heat exchange and so an extra cooling of this zone, due to a greater exposure to coolant flow. As a consequence, in an example, the local temperature may decrease so as to be equal to that of the other zones with the deformable fins 30.

5—Eventually, if the local heat flux decreases at this point, the local temperature also decreases and causes the reduction of the fin tilt, reducing the pressure losses of the coolant flow.

The deformation of the fins 30 may be achieved according to different configurations. As one of numerous examples, with reference to FIG. 2, the fin 30 has a bimetal or bimorph construction. The fin 30 is constituted of two or more metal layers overlaid on top of one another, namely a first layer 30A and a second layer 30B. The fin 30 is connected at one end 30C to the plate 20 (i.e., fixed, secured, integrally formed, welded, adhered, brazed, etc), while the other end 30D is free. The layers 30A and 30B may be laminated from end to end, or may have their ends connected, etc. In other examples provided below, the overlaying of metal layers may be over only a portion of the metal layers. In such a scenarios, the interconnected metal layers of the bimorph construction may have distinct contours.

Figure 2:
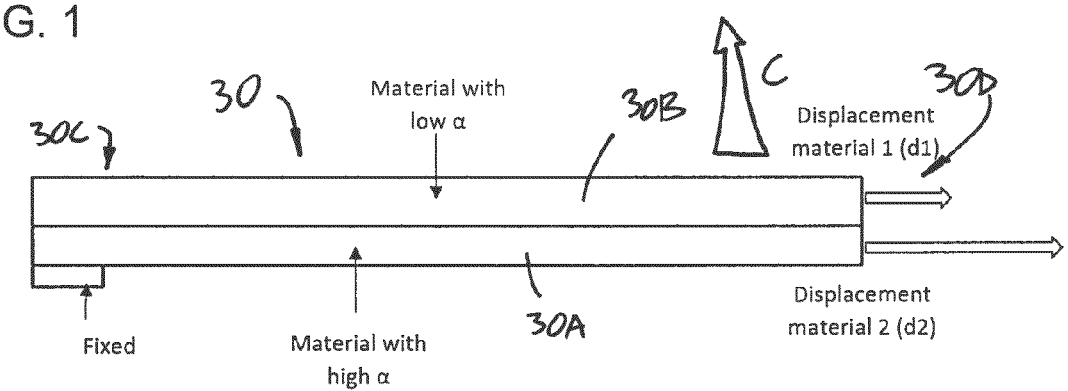
FIG. 2 is a schematic view of a bimetal construction of a deformable fin of the deformable fin heat exchanger of FIG. 1.

The layers 30A and 30B are selected to have a different thermal expansion, notably by having different thermal expansion coefficients $\alpha$. In FIG. 2, the layer 30B has a lower thermal expansion coefficient $\alpha$ than the thermal expansion coefficient $\alpha$ of layer 30A. Accordingly, the displacement resulting from heat exposure is greater for layer 30B than for layer 30A, which results in the deformable fin 30 moving away from the plate 20, i.e., in the direction shown as C in FIG. 2. The working principle of the bimetallic self-adaptive fins is based on the bending theory of a bimetallic strip submitted to uniform heating. Being $\alpha_1$ and $\alpha_2$ the coefficients of thermal expansion (CTE) of each material and assuming $\alpha_2 > \alpha_1$, the length of the metals will change if they are submitted to a temperature rise. If the metals are bonded together, the layer 30A with high CTE will be subject to an axial compressive force, while the layer 30B with low CTE will be under an axial tensile force. This produces a moment that makes the fin 30 bend upwards, in the direction C.

Figure 3A:
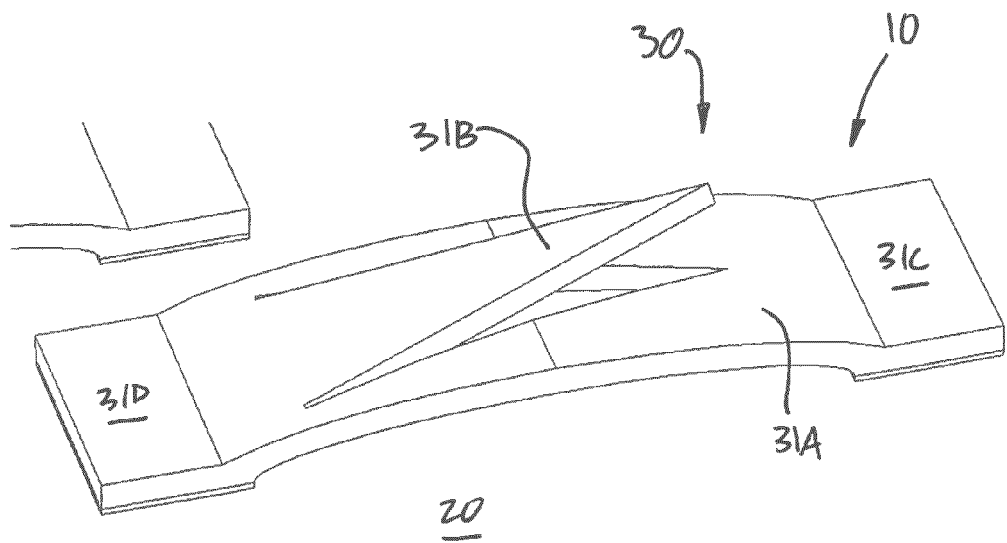
FIG. 3A is a perspective view of a buckling construction of a deformable fin of the deformable fin heat exchanger of FIG. 1.

Referring to FIG. 3A, another contemplated construction of the deformable fin 30 is shown. The fin 30 of FIG. 3A has fin deformation as a result of buckling caused by thermal expansion. The fin 30 has a main body 31A, with a fin portion 31B defined in the main body 31A. The main body 31A is connected at both of its ends, shown as 31C and 31D, to the plate 20. The ends 31C and 31D are connected to the plate 20 in any appropriate way, such as fixed, secured, integrally formed, welded, adhered, brazed, etc. Accordingly, as shown in FIG. 3A, the main body 31A may have a slight buckling curve, between the ends 31C and 31D. The fin portion 31B has an end 31E connected to a remainder of the main body 31A while a remainder of the contour of the fin portion 31B being free. The contour is triangular, although other shapes and geometries may be used as well. In the construction of FIG. 3A, the fin 30 has a greater TCE than that of the plate 20. As the main body 31A increases in temperature due to the conductive connection to the plate 20, it buckles to cause a separation from the free end of the fin portion 31B from a remainder of main body 31A, to increase an exposure of the fin 30 of FIG. 3 to coolant flow.

Figure 3B:
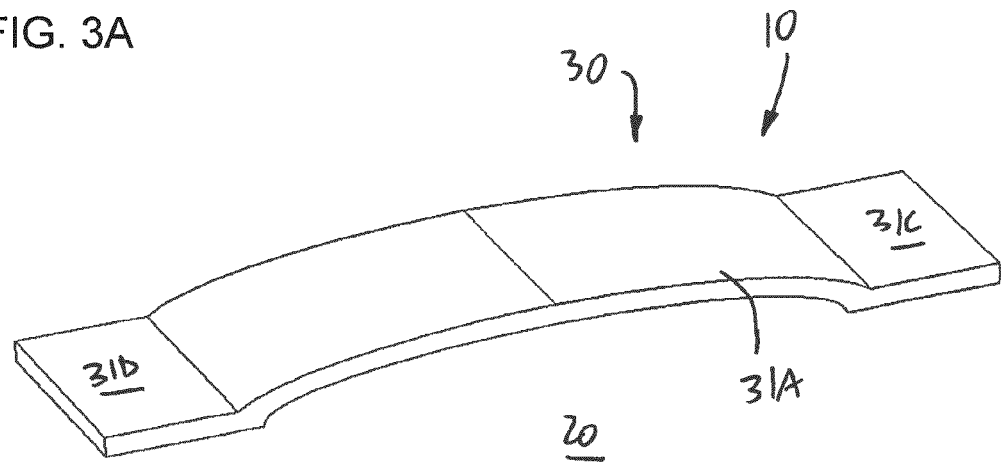
FIG. 3B is a perspective view of another buckling construction of a deformable fin of the deformable fin heat exchanger of FIG. 1.

Referring to FIG. 3B, the fin 30 is shown as having a similar configuration as that of FIG. 3A, though without the fin portion 31B. As the fin 30 is connected at its ends 31C and 31D, the buckling result from greater heat of the plate 20 with increase the height of the arch relative to the plane of the plate 20. An increase in the height of the art may result in an increase of the surface exposed to the coolant flow and/or greater separation from the plane of the plate 20 for greater exposure to the coolant flow. In the construction of FIG. 3B, the fin 30 has a greater TCE than that of the plate 20. A compressive stress is hence imposed on the fin 30, regarded as a doubly clamped beam, and this leads to buckling, i.e. a deformation perpendicular to the surface of the plate 20. There may be an eccentricity or slight bend upward before thermal expansion, to ensure that the buckling causes the fins 30 to move away from the substrate 20.

FIGS. 2, 3A and 3B show two possible constructions of the deformable fins 30, but other kinds of temperature dependent actuators are disclosed herein. For example, shape memory alloys (SMA) fins may be trained in order to obtain one way shape memory effect (OWSME) or two way shape memory effect (TWSME). Through these effects, the trained SMA fins 30 will deform when their temperature increases, allowing to both increase the heat exchange area and/or the vortex generation, in order to locally boost the heat exchange. Once a SMA fin temperature decreases, the SMA fins 30 turn back to their original shape, allowing a reduction of the pumping power needed.

Figure 4:
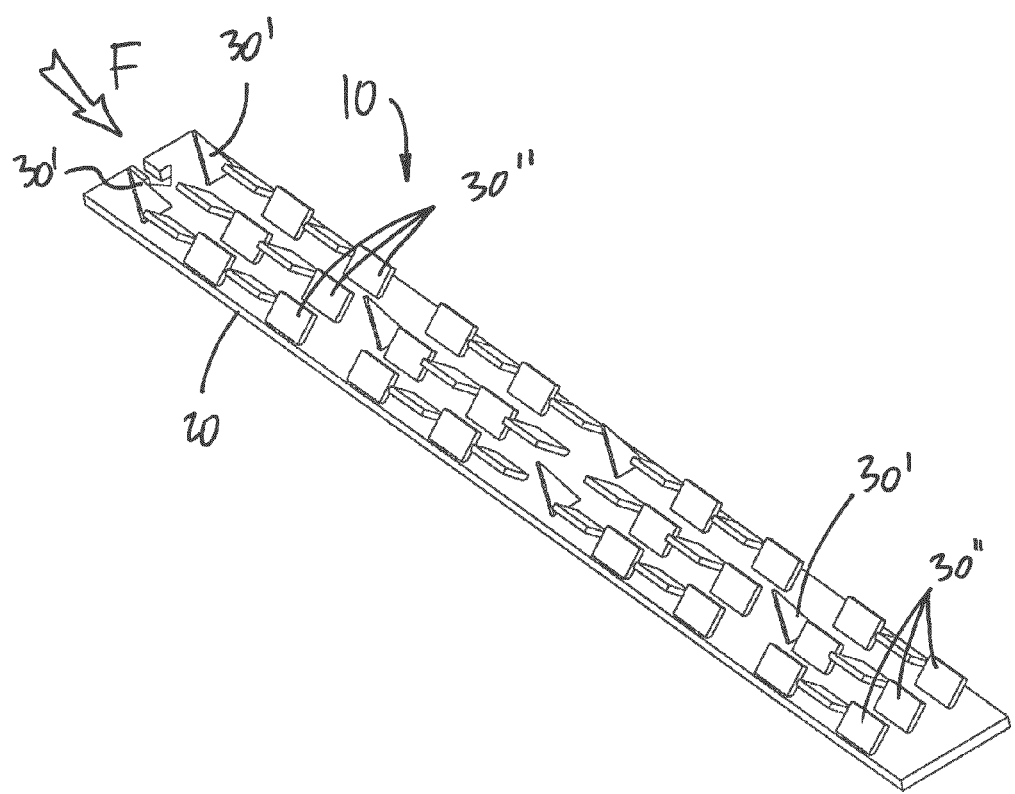
FIG. 4 is a perspective view of an embodiment of the deformable fin heat exchanger of FIG. 1.

Referring to FIG. 4, a perspective view of an embodiment of the deformable fin heat exchanger 10 is shown, in which a distribution of the fins 30 is non uniform. The deformable fins 30 in the deformable fin heat exchanger 10 of FIG. 4 may be constructed in any appropriate way, including those of FIGS. 2, 3A and 3B and/or SMA fins with TWSME. The coolant flow is along direction F and may be induced in any appropriate way, such as with a mechanical and/or electromechanical device (e.g., fan(s), ventilator), by natural convection through temperature and/or pressure gradients. It is observed that the fins 30 may have different geometries. Some of the fins 30, shown as 30', are triangular in shape, whereas others 30" are rectangular in shape. Moreover, it is also observed from FIG. 4 that the orientation of the edge of the fixed end of the fins 30' and 30" may differ. For example, the fins 30' have their fixed end edges oriented to be generally transverse to the direction of the coolant flow F. The fins 30" have their fixed end edges oriented to be generally parallel to the direction of the coolant flow F. Accordingly, the fins 30' play a role of disturbing the coolant flow F, to create some downstream turbulence. The downstream turbulence may for example enhance heat exchange between the coolant flow F and the fins 30, 30', 30". In an embodiment, such fins 30' are placed upstream in the array of fins 30 of the deformable fin heat exchanger 10, as in FIG. 4. Other such fins 30' may be located at other points along the plate 20, to ensure a continuous turbulence. Moreover, the fins 30' may be arranged to raise against the coolant flow F as in FIG. 4, to further assist in creating the turbulence. Stated differently, some of the fins 30' form an acute angle with the plate 20, the acute angle facing the inlet direction of the coolant flow F. In comparison, in FIG. 1, the angle between the fins 30 and the plate 20 is obtuse relative to the flow direction. Now, while such fins 30' are triangular, other shapes are contemplated for these fins, such as square and rectangular. Instead of having a taper away from the plate 20 as the triangular fins 30 do, the square and/or rectangular fins have greater heat exchange surfaces at their free ends.

Some or all of the fins 30" are downstream of the fins 30', and oriented so as not to impede the coolant flow F as much as the fins 30', by being generally along the coolant flow F. Such use of different orientations and shapes may be applied to locally boost the heat exchange, such as by creating a vortex from the turbulence, for heat exchange improvement, but with a greater pressure drop; by increasing the heat exchange surface, but for lower heat exchange improvement, but with lower pressure drop.

Moreover, not all of the fins of the deformable fin heat exchanger 10 may be deformable fins 30. The deformable fin heat exchanger 10 may have a combination of fixed and deformable fins 30 (a.k.a., self-regulated fins). It is also contemplated to use different materials with actuation/deformation at different ranges of temperature. As other possibilities, there may be a greater ratio of fin surface per plate surface at various locations where greater cooling is required. For example, the greater ratio of fin surface per plate surface may be downstream, taking into consideration that the coolant will be cooler downstream. The greater ratio of fin surface per plate surface may be achieved by having larger fins (e.g., rectangular fins over triangular fins) and/or by having more fins by plate surface, for example. The distribution may be said to be non uniform for different reasons: there is no repeating pattern of the fins 30 along the substrate 20; the ratio of fin surface per plate surface is different in different areas of the substrate 20; there are two of more different types and/or different sizes of fins 30 (e.g., 30', 30''); the orientation of the fins 30 is not the same throughout the deformable fin heat exchanger 10; and/or any combination of these reasons.

Figure 5:
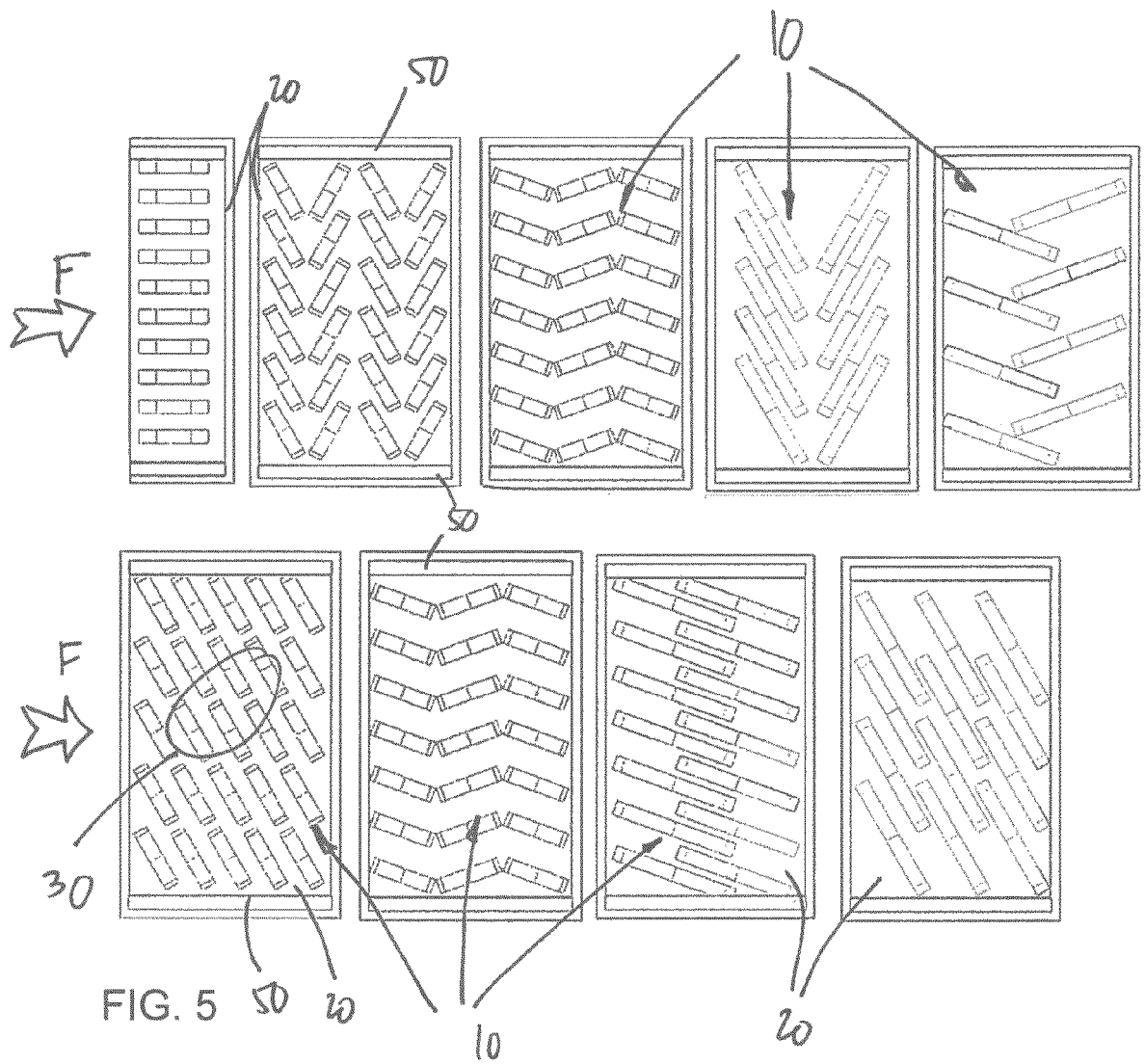
FIG. 5 are exemplary distributions of deformable fins in a deformable fin heat exchanger in accordance with the present disclosure.

By way of example, FIG. 5 shows a plurality of contemplated orientations of the deformable fin heat exchanger 10 of the present disclosure. The array of deformable fins 30 (with or without static fins) may be between side walls 50 to assist in directing the coolant along flow direction F.

Referring to FIGS. 6A-6F, different bimorph constructions are shown for the fin 30, with the layers of higher CTE shown at 30A, and the layers of lower CTE shown at 30B. The fins 30 may have different connection points to the plate 20, and these are shown as 60 in FIGS. 6A-6F, and may be rectangular, round, square, triangular, etc. The layers 30A and 30B may be connected directly to the plate 20 and may thus be folded over or bent to form an anchor 60. As another possibility, the layers 30A and 30B may be fabricated with an integrated anchor 60. In the illustrated embodiments of FIGS. 6A-6F, the areas of interconnection between the layers 30A and 30B are delimited by stippled lines, and shown at 61. The interconnection or lamination may be done by the use of an adhesive, mechanical fasteners, welding, brazing, and/or any other appropriate way to laminate, including by combinations of the afore-mentioned techniques. The expression "lamination" is used to express the coplanarity of the layers 30A and 30B, i.e., the fact that the surfaces (flat or not) remain against one another.

Figure 6A:
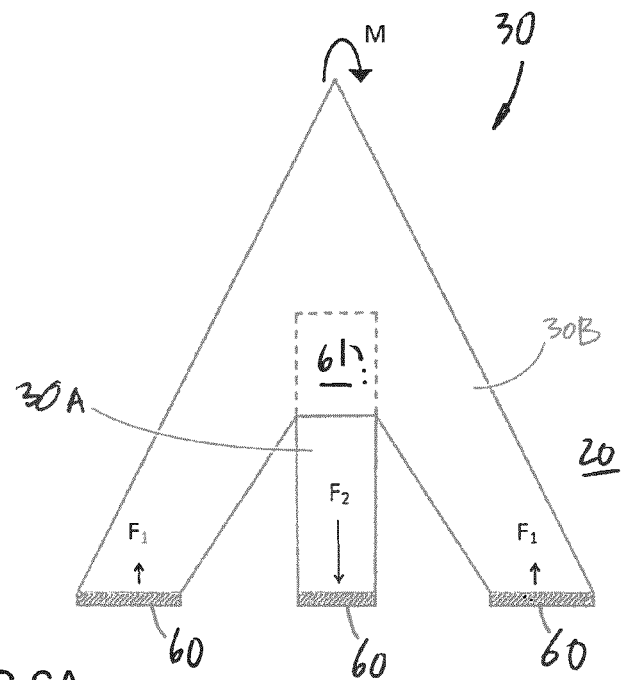
FIGS. 6A-6F are exemplary constructions of bimorph deformable fins based on FIG. 2.

Referring to FIG. 6A, the layer 30A of higher CTE is between the plate 20 and the layer 30B. The layer 30A may be an elongated strip (e.g., rectangular) connected to the layer 30B at its end away from the anchor 60. The layer 30B may be shaped as a V, with the connection area with the layer 30A being at a center of the cavity of the V, and with ends of the V having the anchors 60. F1 and F2 are the forces at which each material is subjected due to the behavior of the other material. As the higher CTE material is placed below, the fin 30 may buckle upwards and thus rise relative to the plate 20.

Figure 6B:
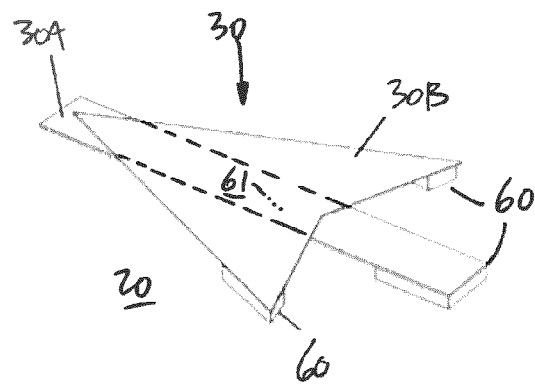

Referring to FIG. 6B, the fin 30 is shown having an elongated strip for higher CT layer 30A (e.g., rectangular), with layer 30B also being V-shape, though being closer to a triangular shape. The layer 30A may extend beyond the tip of the V-shape.

Figure 6C:
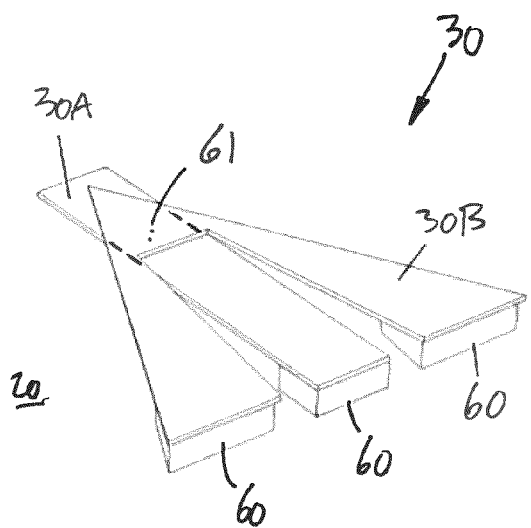

Referring to FIG. 6C, a construction similar to that of FIGS. 6A and 6B is shown, but with a central portion of the layer 30B having a greater cutout to cause a reduction in mechanical stresses during thermal expansion and deformation.

Figure 6D:
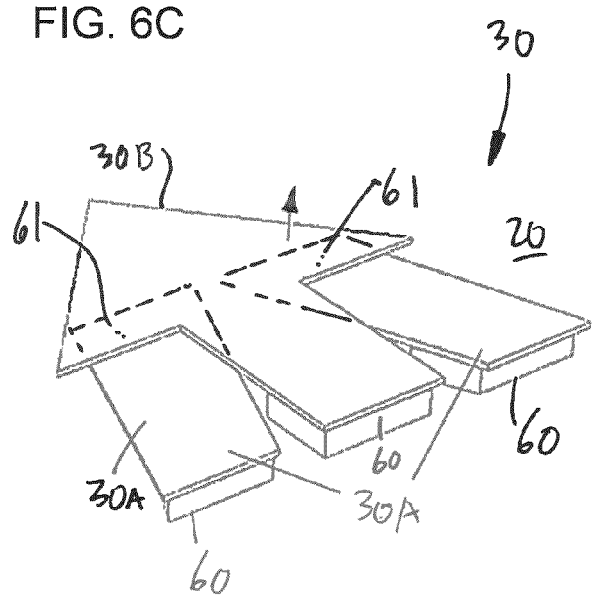

Referring to FIG. 6D, a pair of strips of the layer 30A are present, shown as being parallelograms but alternatively rectangular, trapezoid, etc. The layer 30B is connected at its cantilevered end to the strips of the layer 30A. The cantilevered end of the layer 30B may feature an enlargement for ensure a suitable size for the connection areas 61. For example, the layer 30B may have an arrow shape.

Figure 6E:
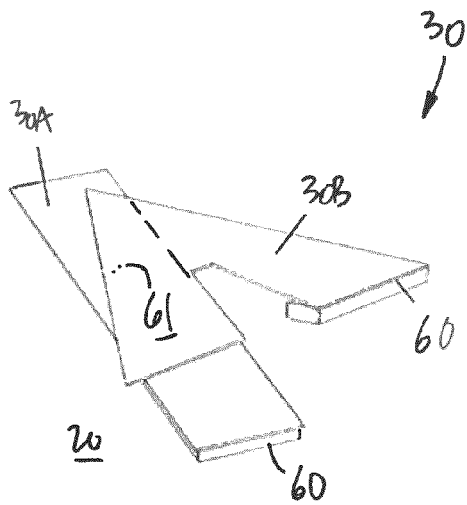

Referring to FIG. 6E, a construction similar to that of FIG. 6C is shown, with a central portion of the layer 30B having a greater cutout to cause a reduction in mechanical stresses during thermal expansion and deformation. The elongated strip forming the layer 30A is connected to the layer 30B at a cantilevered end of the V. In the construction of FIG. 6E, higher CTE layer 30A pushes from one side the triangular figure of the lower CT layer 30B. The higher CTE material is placed below the lower CTE material to ensure upward deformation. Both layers 30A and 30B are anchored to the plate 20 in the manner shown. With the construction of FIG. 6E, the generation of flow vortices inside the channel is expected to improve due to the non-symmetric deformations.

Figure 6F:
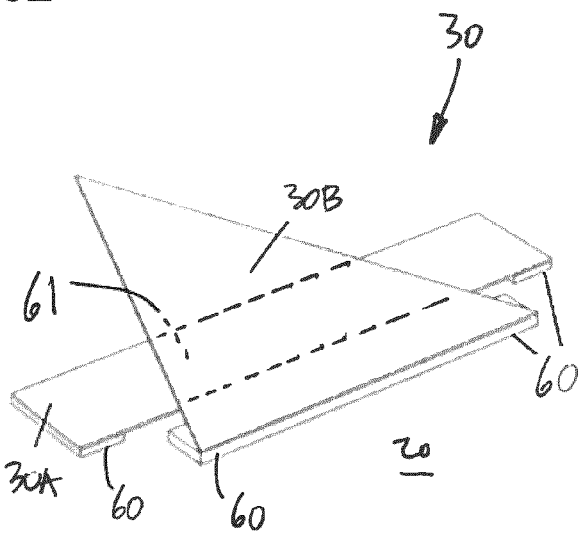

Referring to FIG. 6F, the layer 30A may be an elongated strip connected to the plate 20 via the anchors 60 at both ends, i.e., a doubly clamped layer 30A. The interconnection area 61 may be for example trapezoid shaped.

In all of the embodiments of FIGS. 6A-6F, the layers 30A and 30B have distinct shapes, i.e., they differ in shape relative to one another, they are not identical, they are dissimilar. In one or more of the embodiments of FIGS. 6A-6F, the area 61 may be smaller than a remainder of the total surface of the layer 30A and/or than a remainder of the total surface of the layer 30B. In one or more of the embodiments of FIGS. 6A-6F, the total surface of the layer 30A is smaller than the total surface of the layer 30B. In one or more of the embodiments of FIGS. 6A-6F, the layers 30A and/or the layers 30B have a cantilevered end relative to the plate 20, via anchors 60.

The deformable fins 30 according to FIGS. 2-6F described above may be used for cooling microelectronics, LEDs, MEMS, photovoltaics and other microfabricated devices. To realise arrays of sub-millimeter fins 30 at low cost, microfabrication techniques based on lithography, film deposition and etching can be used. These methods consist of the repeated deposition of thin or thick films, using photolithography to optically pattern a photosensitive masking resist, and etching the regions of the films that are not covered by the resist. This leaves patterned films on the surface of a substrate (typically a silicon wafer or metal sheet or plate). This process is repeated to build a stack of layers. Since the film thicknesses can range from 0.1 to 100 microns and the optically defined feature sizes can range from 1 um to 1 mm, miniature fins 30 can be fabricated. Furthermore, arrays of fins 30 are readily fabricated without additional complexity, since the optical patterning can expose all the fins 30 in one exposure, followed by an etch step that also defines all the fins in one step.

Figure 7:
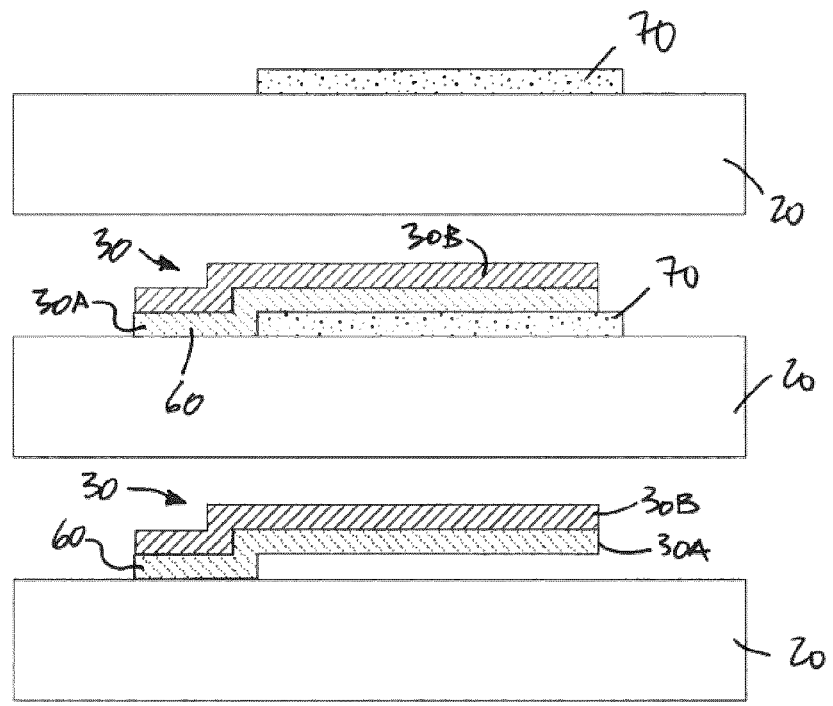
FIG. 7 is a schematic view showing a method of fabricating a bimorph deformable fin as in FIG. 2, in accordance with the present disclosure.
Figure 8:
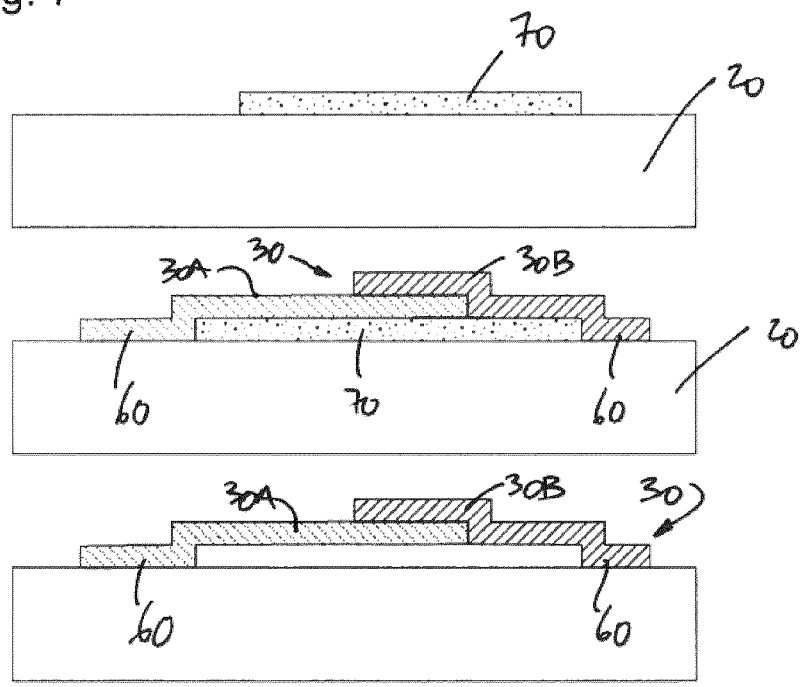
FIG. 8 is a schematic view showing a method of fabricating a bimorph deformable fin as in FIGS. 6A-6F, in accordance with the present disclosure.
Figure 9:
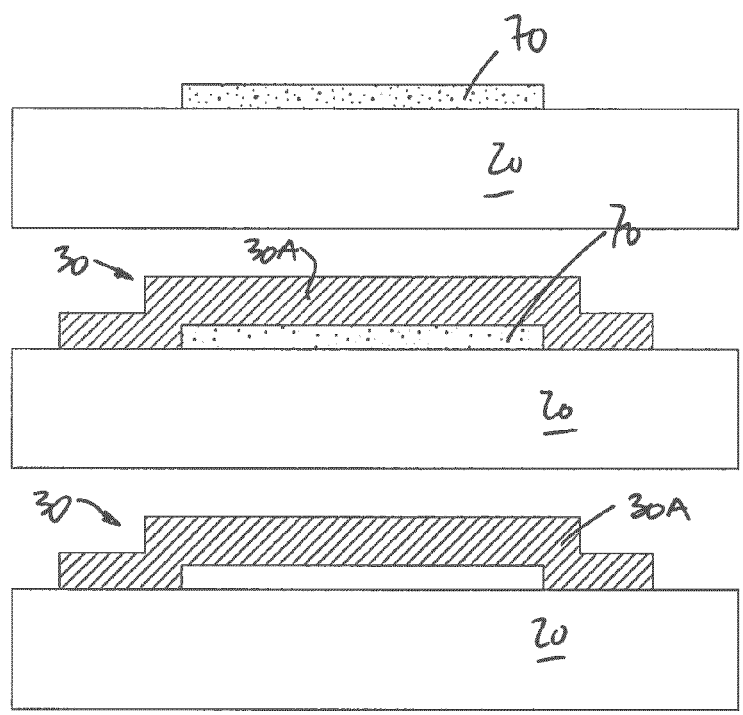
FIG. 9 is a schematic view showing a method of fabricating a deformable fin as in FIGS. 3A and 3B.

To realise the different types of fins 30 of the present disclosure, variants of the above method may be used, as illustrated in FIGS. 7-9. Some of the variants involve a sacrificial film 70 that is deposited and patterned first, followed by one or more structural patterned films, shown as the layers 30A and/or 30B. After all the films are deposited and patterned, the sacrificial film 70 is etched selectively, meaning that it is removed without attacking the structural film(s) 30A, 30B and substrate 20. If the chemical etchant may attack the substrate 20, the latter can be initially covered with a protective film before the fin fabrication.

For the formation of the bimorph fins such as in FIG. 2 and in FIGS. 6A-6F, two or more patterned structural films may be deposited over the patterned sacrificial film 70, as shown in FIGS. 7 and 8, with FIG. 8 being exemplary of the leveraged constructions of FIGS. 6A-6F. The two structural films will define the layers 30A and 30B having a different thermal expansion coefficient such that the resulting fin 30 curls upwards when heating, as exemplified in FIG. 2. A non-exhaustive and non-limitative list of examples of low thermal expansion materials for the layer 30B includes: Si (3 ppm); $Si_3N_4$ (3.5 ppm); Mo (5 ppm); Cr (6 ppm); Nb (7 ppm); Ti (8.4 ppm). A non-exhaustive and non-limitative list of examples of high thermal expansion materials for the layer 30A includes: polymers, such as polyimide (30-70 ppm); Ag (22 ppm); Au (14 ppm); Ni (13 ppm). A non-exhaustive and non-limitative list of examples of sacrificial materials includes: resist; Si; $SiO_2$; Al; W, which can be etched selectively with respect to many of the structural materials. If Si is used as a sacrificial material and a substrate materials, then a protective $Si_3N_4$ layer can be first deposited on the Si substrate to protect it during the release etch.

To realise arrays of fins at dimensions above a few millimeters, microfabrication methods are not as well suited and should be fabricated by more traditional methods. Although the fins 30 can be fabricated individually and assembled on the hot substrate, i.e., the plate 20, such an approach would limit the feasibility of fin arrays due to fabrication complexity. An alternate approach which is more amenable to manufacturing consists of forming the fins 30 into a ceramic, metal or polymer foil (thin sheet forming the layers 30A/30B)) and then laminating the foil onto the plate 20 or like substrate. The fins 30 can be formed in the foil before the lamination by machining, punching, stamping, etching, water jet cutting or laser jet cutting through the foil. Only the contour of the movable part of the fins 30 needs to be cut, such that the fins 30 remain attached to the foil by their base, at anchor 60. The foil can be fixed by adhesive (glue), solder, welding, brazing, fusion bond or another permanent method. To allow motion of the fins 30 after assembly, a recess may be formed in the substrate or plate 20 in the movable zones, or adhesive/solder/brazing materials may only present in the non-movable zones, allowing the fins 30 (movables zones) to freely deform.

For the buckling fins, only one layer of foil 30A may be required, as shown in FIG. 9. It must be made of a material with higher thermal expansion than the substrate 20. For the bimorph fins 30 of FIGS. 6A-6F, two foil layers are laminated to define the layers 30A and 30B of materials with different thermal expansion coefficients. In an embodiment, a foil of SMA may also be patterned with the fin structures, trained, then laminated to the plate 20. The plate 20 may itself be fabricated by lamination of multiple foils of similar material, simply to form fixed flow passages in the plate 20 and required recess under the movable zones of the fins 30. The films deposited for the structural layers 30A, 30B range from 1 to 100 micrometers, whereas the sacrificial films 70 range from 0.1 to 10 micrometers. The typical widths and lengths of the fins 30 range from 10 micrometers to 2 millimeters.

The above described specific performances of the proposed heat sink are based on the implementation, along the cooling scheme, of one or several kinds of fins 30 that locally improve the heat exchange in the zones where the temperature is high. This local improvement is obtained by the implementation of heat exchange elements that change their shape as a function of the local temperature, without any kind of remote control, i.e., the system is passive.

Moreover, the deformable fin heat exchanger 10 may operate without the use of sensors and externally driven actuators because of the use of materials that deform as a function of temperature. The deformable fins 30 are therefore their own sensor and actuator, without requiring external electrical power or other connections. This makes the deformable fin heat exchanger 10 reliable, easily integrated into large arrays, and robust.

Hence, the deformable fin heat exchanger 10 is a heat sink with an array of fins, many of which are deformable fins 30 that locally deform to adapt the thermal resistance as a function of the local temperature. The fins 30 consist of shape memory alloys, bimorph structures, etc that may be parallel to the flow direction at low temperature but deform to perturb the flow as the temperature locally increases. The flow perturbation reduces the local thermal resistance, allowing high heat flux without increasing the plate temperature. The proposed device has the ability to enhance temperature uniformity of the cooled object under variable and non-uniform heat flux. The deformable fin heat exchanger 10 self regulates, as a function of the local temperature, the local heat extraction capacity in order to maintain constant the temperature along the whole cooled object.

Various applications may benefit from the use of one or more of the deformable fin heat exchanger 10. For example, in the field of microelectronics, multichip modules may be equipped with one or more of the deformable fin heat exchanger 10, where each chip requires a constant temperature but has time varying loads. In LED and PV arrays, arrays of diodes or photovoltaic cells that are interconnected electrically should remain at a uniform temperature to optimise the overall performance, and could thus use the deformable fin heat exchangers 10. In chemical processing, the heat load in reactors or other thermochemical processes can vary over time and throughout the system due to non-uniform reaction or mass transport, and such non-uniform temperature may lead to and poor process control, whereby deformable fin heat exchangers 10 may be used. In biological and biomedical applications, heat sinks and thermoelectric modules are required to maintain a constant temperature for essays, but must be over designed to meet spatial and temporal variations, whereby deformable fin heat exchangers 10 may be used. These examples are non-limitative illustrations of possible uses of the deformable fin heat exchangers 10, and numerous other applications are contemplated.

What is claimed is:

1. A heat exchanger comprising a base adapted to be conductively contacting a load, and a plurality of deformable fins connected to a surface of the base with the plurality of deformable fins adapted to be exposed to a coolant flow over the surface, at least some of the deformable fins having a free portion configured to move away from the surface of the base as a function of a local temperature increase of the base through conductive contact with the load, the deformable fins distributed on the surface of the base to be exposed to a coolant flowing over the surface of the base, wherein a heat exchange through the deformable fins being non-uniform across the surface of the base, wherein the plurality of deformable fins includes at least a first type of deformable fins and a second type of deformable fins, the first type and the second type differing in orientation of connection with the surface of the base, the orientation of connection being defined by a junction between the deformable fins and the base, the orientation of connection of the first type of deformable fins being transverse to the orientation of connection of the second type of deformable fins.

2. The heat exchanger according to claim 1, wherein the first type and the second type differing in size and/or shape.

3. The heat exchanger according to claim 1, wherein the distribution includes an upstream area having a first ratio of fin surface per substrate surface and a downstream area having a second ratio of fin surface per substrate surface.

4. The heat exchanger according to claim 3, wherein the second ratio is greater than the first ratio.

5. The heat exchanger according to claim 1, further comprising walls projecting upwardly from the surface of the base, the walls adapted to be aligned with a coolant flow to define a convection passage.

6. The heat exchanger according to claim 5, wherein at least some of the deformable fins have main heat exchange surfaces generally transverse to a direction of the coolant flow.

7. The heat exchanger according to claim 5, wherein at least some of the deformable fins have main heat exchange surfaces generally parallel to a direction of the coolant flow.

8. The heat exchanger according to claim 1, wherein at least some of the deformable fins have both ends connected to the surface of the base, and forming an arch.

9. The heat exchanger according to claim 1, wherein at least some of the deformable fins are bimetal or bimorphic fins.

10. The heat exchanger according to claim 1, wherein at least some of deformable fins have a body connected at opposed ends to the surface, and a fin portion configured to buckle away from the surface as a function of a local temperature increase of the base.

11. The heat exchanger according to claim 1, wherein the plurality of deformable fins includes at least a first type of deformable fins and a second type of deformable fins, the first type and the second type differing in shape.

12. The heat exchanger according to claim 1, wherein a distribution of the deformable fins is non-uniform across the surface of the base.

* * * * *